United States Patent
Gillespie et al.

(10) Patent No.: US 6,798,039 B1
(45) Date of Patent: Sep. 28, 2004

(54) INTEGRATED CIRCUIT INDUCTORS HAVING HIGH QUALITY FACTORS

(75) Inventors: Timothy Gillespie, Beverly Hills (AU); Peter Knight, Thornleigh (AU)

(73) Assignee: Integrated Device Technology, Inc., Santa Clara, CA (US)

( * ) Notice: Subject to any disclaimer, the term of this patent is extended or adjusted under 35 U.S.C. 154(b) by 128 days.

(21) Appl. No.: 10/274,590

(22) Filed: Oct. 21, 2002

(51) Int. Cl.[7] ............................................. H01L 29/00
(52) U.S. Cl. .............................. 257/531; 257/E23.142; 257/508; 257/758; 324/318
(58) Field of Search ..................... 257/E23.142, 508, 257/531, 758; 324/318

(56) References Cited

U.S. PATENT DOCUMENTS

| | | |
|---|---|---|
| 5,446,311 A | 8/1995 | Ewen et al. |
| 5,481,131 A | 1/1996 | Staudinger et al. |
| 5,717,243 A | 2/1998 | Lowther |
| 5,760,456 A | 6/1998 | Grzegorek et al. |
| 5,793,272 A | 8/1998 | Burghartz et al. |
| 5,834,825 A | 11/1998 | Imai |
| 5,884,990 A | 3/1999 | Burghartz et al. |
| 5,892,425 A | 4/1999 | Kuhn et al. |
| 5,918,121 A | 6/1999 | Wen et al. |
| 5,936,299 A | 8/1999 | Burghartz et al. |
| 5,969,590 A | 10/1999 | Gutierrez |
| 6,008,713 A | 12/1999 | Nasserbakht |
| 6,054,329 A | 4/2000 | Burghartz et al. |
| 6,060,882 A * | 5/2000 | Doty ........................... 324/318 |
| 6,072,205 A | 6/2000 | Yamaguchi et al. |
| 6,114,937 A | 9/2000 | Burghartz et al. |
| 6,159,817 A | 12/2000 | Altimari et al. |
| 6,160,303 A | 12/2000 | Fattaruso |
| 6,191,468 B1 | 2/2001 | Forbes et al. |
| 6,259,325 B1 | 7/2001 | Ishizuka et al. |
| 6,287,932 B2 | 9/2001 | Forbes et al. |
| 6,310,386 B1 | 10/2001 | Shenoy |
| 6,342,424 B1 | 1/2002 | Pichler |
| 6,348,391 B1 | 2/2002 | Fattaruso |
| 6,358,820 B1 | 3/2002 | Maeda |
| 6,362,012 B1 | 3/2002 | Chi et al. |
| 2003/0030532 A1 | 2/2003 | Iida ............................ 336/200 |

OTHER PUBLICATIONS

Van der Tang et al., "Analysis and Design of an Optimally Coupled 5–GHz Quadrature LC Oscillator," IEEE Journal of Solid–State Circuits, vol. 37, No. 5, May 2002, pp. 657–661.

* cited by examiner

Primary Examiner—David Nelms
Assistant Examiner—Mai-Huong Tran
(74) Attorney, Agent, or Firm—Myers Bigel Sibley & Sajovec

(57) ABSTRACT

Integrated circuit inductors achieve high quality factors by replacing a single conductive strand having a first cross-sectional area with a plurality of conductive strands having a combined second cross-sectional area that is smaller than the first cross-sectional area and a combined periphery that is greater than a periphery of the single conductive strand. The dimensions of the plurality of the conductive strands are greater than a skin depth at a desired operating frequency. This results in slightly higher dc resistance, but significantly lower ac resistance. The conductive strands are electrically coupled in parallel and extend side-by-side across an integrated circuit substrate. These strands include a plurality of crossing strand segments that enable the respective strand to be repeatedly transposed from one side of the plurality of strands to another side of the plurality of strands without electrical interruption. In some embodiments, the plurality of strands extend side-by-side in a horizontal plane that is at least substantially parallel to a surface of the integrated circuit substrate. In these embodiments, the crossing strand segments may be treated as cross-over/under strand segments.

22 Claims, 9 Drawing Sheets

INTEGRATED CIRCUIT INDUCTORS HAVING HIGH QUALITY FACTORS

FIELD OF THE INVENTION

The present invention relates to integrated circuit devices and, more particularly, to integrated circuit devices having passive energy storage elements thereon.

BACKGROUND OF THE INVENTION

Conventional integrated circuit device fabrication methods have typically not included techniques to form high quality factor (Q) inductors on integrated circuit substrates. For microwave and wireless communication applications, it may be advantageous to integrate high-Q inductors on bulk silicon, silicon-on-insulator (SOI) or silicon-on-sapphire (SOS) substrates. The quality factor (Q) is expressed by the equation $Q=\omega L/R$, where $\omega$ represents resonant frequency, L represents inductance and R represents resistance. Attempts to fabricate high-Q inductors have typically been limited by the fact that conventional wiring interconnect technologies frequently result in conductors and vias having relatively high series resistance when summed together along the length of the inductor. Moreover, integrated circuit inductors may generate magnetic fields that are strongly coupled to an underlying semiconductor substrate, which may act as a lossy conductor having a large skin depth. As will be understood by those skilled in the art, such strong coupling may generate eddy currents within the substrate and these currents act in opposition to currents established in the inductor. Accordingly, strong coupling between an inductor and a semiconductor substrate may operate to reduce the inductance L of the inductor and cause energy loss.

Attempts have been made to fabricate integrated circuit inductors having high quality factors. One such attempt is disclosed in U.S. Pat. No. 6,114,937 to Burghartz et al., which is entitled "Integrated Circuit Spiral Inductor." In particular, the '937 patent discloses a spiral inductor having a spiral metal coil that is deposited into a trench formed in a dielectric layer, which extends over a substrate. The metal coil is enclosed in ferromagnetic liner and cap layers, and is connected to an underpass contact through a metal filled via in the dielectric layer. The spiral inductor also includes ferromagnetic core lines surrounded by the metal spiral coil (see, e.g., '937 patent, FIG. 13). Another attempt is disclosed in U.S. Pat. No. 5,446,311 to Ewen et al., which is entitled "High-Q Inductors in Silicon Technology Within Expensive Metallization." In particular, the '311 patent discloses an inductor structure that is formed using multiple metallization levels in a conventional integrated circuit technology in which inductor turns utilize the multiple levels to reduce the inductor resistance (see, e.g., '311 patent, FIG. 3). U.S. Pat. Nos. 5,892,425, 5,936,299, 6,160,303 and 6,348,391 also disclose a variety of integrated circuit inductors.

Notwithstanding these attempts to develop inductors that are suitable for fabrication on integrated circuit substrates, there continues to be a need for inductors having high quality factors. There also continues to be a need for inductors that may be fabricated using process techniques that yield inductors having highly reproducible quality factors.

SUMMARY OF THE INVENTION

Integrated circuit inductors according to embodiments of the present invention achieve high quality factors by replacing a single conductive strand having a first cross-sectional area with a plurality of conductive strands having a combined second cross-sectional area that is smaller than the first cross-sectional area and a combined periphery that is greater than a periphery of the single conductive strand. The dimensions of the plurality of the conductive strands are greater than a skin depth at a desired operating frequency. In particular, embodiments of the present invention include a plurality of strands of conductive traces (e.g., metal traces) that are electrically coupled in parallel and extend side-by-side across an integrated circuit substrate. This substrate may be, for example, a bulk semiconductor substrate (e.g., silicon chip), an silicon-on-insulator (SOI) substrate or a silicon-on-sapphire (SOS) substrate. Each of the plurality of strands also includes a plurality of crossing strand segments that enable the respective strand to be repeatedly transposed from one side of the plurality of strands to another side of the plurality of strands without electrical interruption. In some embodiments, the plurality of strands extend side-by-side in a horizontal plane that is at least substantially parallel to a surface of the integrated circuit substrate. In these embodiments, the crossing strand segments may be treated as crossover/under strand segments. In other embodiments, the plurality of strands extend side-by-side in a vertical plane that is at least substantially orthogonal to a surface of said integrated circuit substrate. According to preferred aspects of these embodiments, the plurality of strands are electrically insulated from each other over at least a majority of their length.

Each of the plurality of strands of conductive traces may include a corresponding plurality of primary strand segments that are electrically linked together end-to-end by a corresponding plurality of the crossing strand segments. The primary strand segments and the crossing strand segments may be formed on different levels of metallization (e.g., metal N and metal N+1 in a process having at least two levels of metallization). To provide electrical continuity, the primary strand segments and the crossing strand segments for each respective strand are electrically coupled together by conductive vias that extend through an electrically insulating layer disposed between the different levels of metallization.

In other embodiments, an inductor having a high quality factor includes an integrated circuit substrate and a plurality of first strands of conductive traces that are electrically coupled in parallel and extend side-by-side across the integrated circuit substrate. Each of the plurality of first strands includes a respective plurality of crossing strand segments at a first level of metallization that enable the respective first strand to be repeatedly transposed from one side of the plurality of first strands to another side of the plurality of first strands without electrical interruption. Each of the plurality of first strands also includes a corresponding plurality of primary strand segments that are electrically linked together end-to-end by a corresponding plurality of the crossing strand segments. The crossing and primary strand segments associated with each of the plurality of first strands may be electrically coupled together by conductive vias that extend through an electrically insulating layer disposed between the different levels of metallization. A plurality of second strands of conductive traces are also provided. These second strands are electrically coupled in parallel and extend side-by-side across the integrated circuit substrate. In some embodiments, these second strands may extend directly above or below the first strands. Each of the plurality of second strands includes a respective plurality of jumper strand segments at a second level of metallization that enable the respective second strand to electrically jump a plurality of the crossing strand segments associated with the plurality of first strands. These jumper strand segments may be contiguous with the primary strand segments that make up the first strands.

According to still further embodiments of the present invention, an inductor includes a semiconductor substrate and a plurality of strands of conductive traces that are electrically coupled in parallel and extend side-by-side across the semiconductor substrate in a horizontal plane that is at least substantially parallel to a surface of the semiconductor substrate. In these embodiments, each of the plurality of strands includes a plurality of crossing strand segments that enable the respective strand to be repeatedly transposed from one side of the plurality of strands to another side of the plurality of strands without electrical interruption. To reduce lossy eddy currents in the substrate, a plurality of alternating N-well and P-well regions are disposed side-by-side therein. These well regions, which extend underneath the plurality of strands, are preferably elongate regions that extend in a direction at least substantially orthogonal to the plurality of strands.

DESCRIPTION OF PREFERRED EMBODIMENTS

Figure 1A:
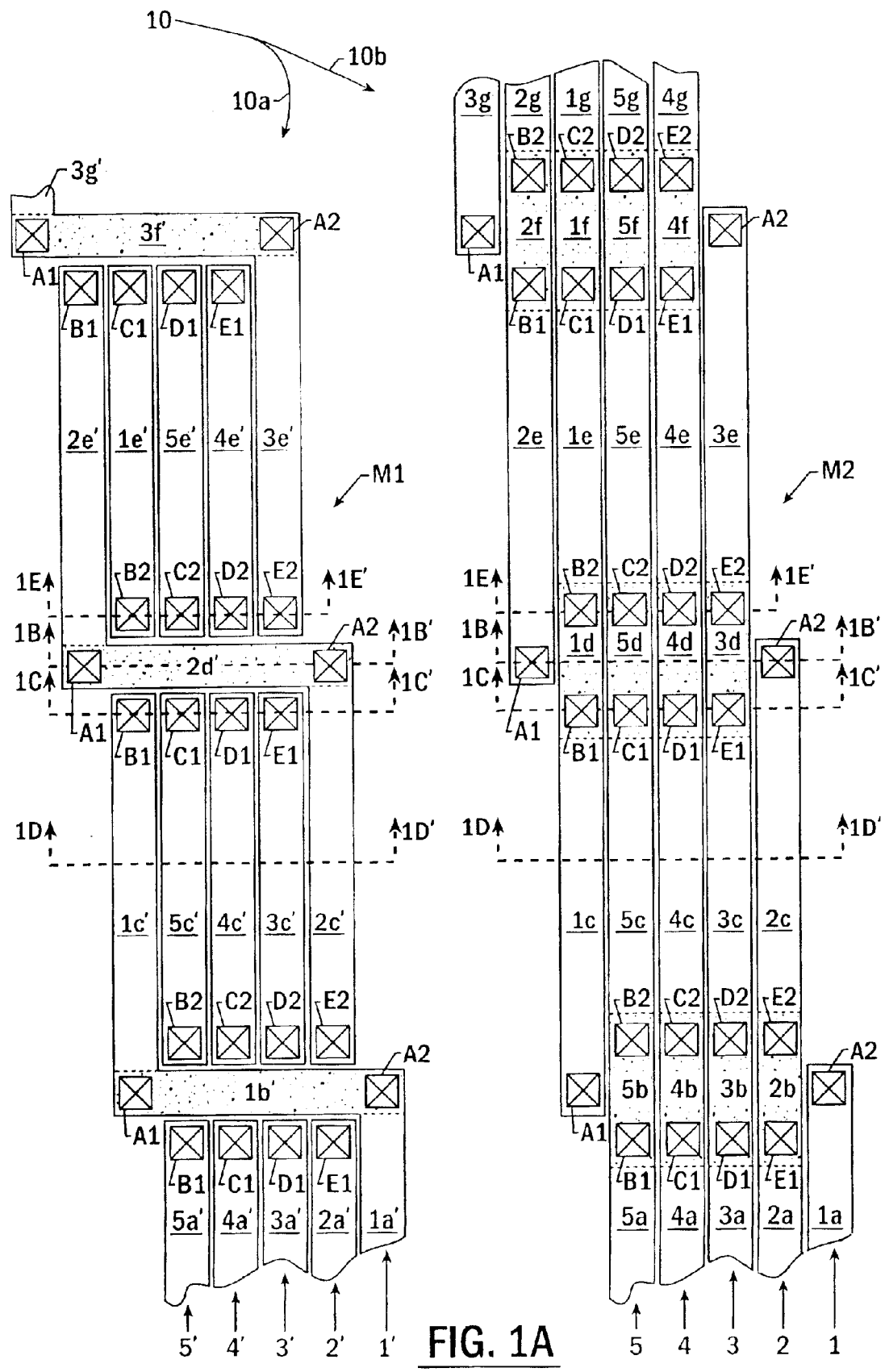
FIG. 1A is a plan view of a multi-strand inductor according to an embodiment of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Referring now to FIGS. 1A–1E, an integrated circuit inductor 10 according to one embodiment of the present invention will be described. The illustrated inductor 10 utilizes two levels of metallization, however, inductors according to alternative embodiments of the present invention may utilize a greater number of metallization layers. The regions of the inductor 10 associated with first and second levels of metallization are illustrated by reference numerals 10a and 10b, respectively. In a fabrication process requiring two or more levels of metallization, the first level of metallization may be patterned below or above the second level of metallization. The first and second levels of metallization may be consecutive levels of metallization or one or more intervening levels of metallization may also be present between the first and second levels of metallization. For purposes of discussion herein, the first level of metallization (M1) will be treated as the lowest level of metallization utilized in the fabrication process and the second level of metallization (M2) will be treated as the next higher level of metallization relative to the first level of metallization (M1).

The inductor 10 of FIGS. 1A–1E includes a plurality of first strands of conductive traces that extend side-by-side across an integrated circuit substrate. In some embodiments, this integrated circuit substrate may include a bulk semiconductor substrate layer 14 of predetermined conductivity type (e.g., P-type, N-type), as shown in FIGS. 1B–1E. The plurality of first strands of conductive traces are illustrated as five (5) strands 1–5 that are electrically coupled in parallel. Inductors having more or less strands may also be used. A portion of the first strand 1 is illustrated as including two primary strand segments at the second level of metallization M2 and one crossing strand segment at the first level of metallization M1. These two primary strand segments are shown as 1a and 1c–1g on the right hand side of FIG. 1A. The crossing strand segment is illustrated as a cross-under strand segment 1b' on the left side of FIG. 1A. Conductive vias A1 and A2 electrically connect strand segments 1a and 1c (at M2) to opposite ends of the cross-under stand segment 1b' (at M1). A portion of the second strand 2 is illustrated as including two primary strand segments at the second level of metallization M2 and one crossing strand segment at the first level of metallization M1. These two primary strand segments are shown as segments 2a–2c and 2e–2g on the right hand side of FIG. 1A. The crossing strand segment is illustrated as a cross-under strand segment 2d' on the left side of FIG. 1A. Conductive vias A1 and A2 electrically connect strand segments 2c and 2e (at M2) to opposite ends of the cross-under stand segment 2d' (at M1). A portion of the third strand 3 is illustrated as including two primary strand segments at the second level of metallization M2 and one crossing strand segment at the first level of metallization M1. These two primary strand segments are shown as segments 3a–3e and 3g on the right hand side of FIG. 1A. The crossing strand segment is illustrated as a cross-under strand segment 3f' on the left side of FIG. 1A. Conductive vias A1 and A2 electrically connect strand segments 3e and 3g (at M2) to opposite ends of the cross-under stand segment 3f' (at M1). A portion of the fourth strand 4 is illustrated as including a primary strand segment at the second level of metallization M2. This primary strand segment is shown as segments 4a–4g on the right hand side of FIG. 1A. A portion of the fifth strand 5 is illustrated as including a primary strand segment at the second level of metallization M2. This primary strand segment is shown as segments 5a–5g on the right hand side of FIG. 1A.

The inductor 10 of FIGS. 1A–1E also includes a plurality of second strands of conductive traces that extend side-by-side across the integrated circuit substrate. The plurality of second strands of conductive traces are illustrated as five (5) strands 1'–5' that are electrically coupled in parallel. A portion of the first strand 1' is illustrated as including primary strand segments 1a', 1c' and 1e' and crossing strand segment 1b' at the first level of metallization M1, and jumper strand segment 1d at the second level of metallization M2. A portion of the second strand 2' is illustrated as including primary strand segments 2a', 2c' and 2e' and crossing strand segment 2d' at the first level of metallization M1 and jumper strand segment 2b at the second level of metallization M2. A portion of the third strand 3' is illustrated as including primary strand segments 3a', 3c', 3e' and 3g' and crossing strand segment 3f' at the first level of metallization M1 and jumper strand segments 3b and 3d at the second level of metallization M2. A portion of the fourth strand 4' is illustrated as including primary strand segments 4a', 4c', 4e' at the first level of metallization M1 and jumper strand segments 4b and 4d at the second level of metallization M2. A portion of the fifth strand 5' is illustrated as including primary strand segments 5a', 5c', 5e' at the first level of metallization M1 and jumper strand segments 5b and 5d at the second level of metallization M2.

Figure 1B:
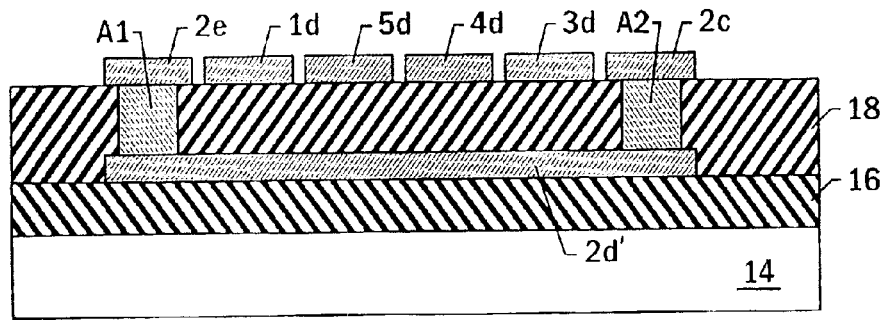
FIG. 1B is a cross-section view of the inductor of FIG. 1A, taken along lines 1B–1B'.
Figure 1C:
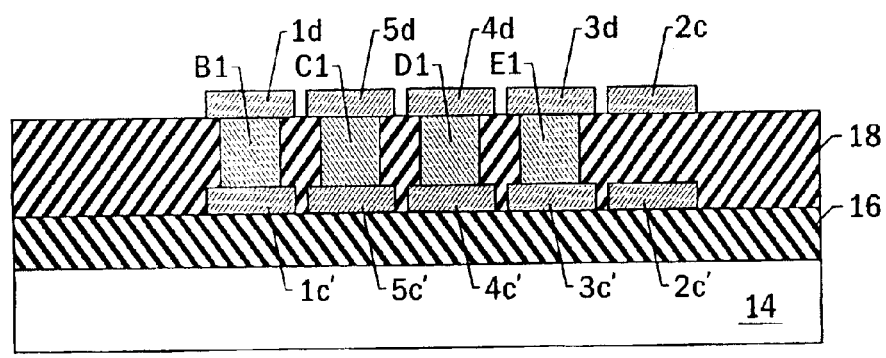
FIG. 1C is a cross-section view of the inductor of FIG. 1A, taken along lines 1C–1C'.
Figure 1D:
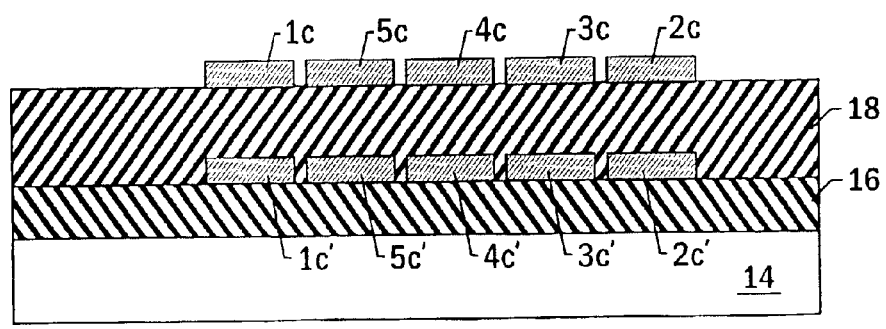
FIG. 1D is a cross-section view of the inductor of FIG. 1A, taken along lines 1D–1D'.
Figure 1E:
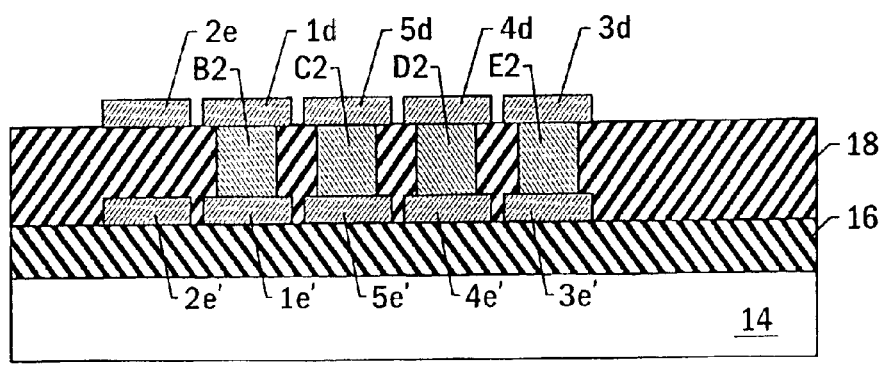
FIG. 1E is a cross-section view of the inductor of FIG. 1A, taken along lines 1E–1E'.

FIGS. 1B–1E illustrate cross-sectional views of the inductor of FIG. 1A, taken along respective cross-sectional lines (1B–1B' to 1E–1E'). In FIG. 1B, the crossing segment 2d' is illustrated as being disposed on a first electrically insulating layer 16. This crossing segment 2d' is electrically coupled to the primary segments 2c and 2e by a pair of conductive vias, shown as A1 and A2. These primary segments 2c and 2e are patterned on a second electrically insulating layer 18. The illustrated portions of the primary segments include jumper strand segments 1d, 5d, 4d, 3d. In FIG. 1C, the conductive vias B1, C1, D1 and E1 are illustrated as joining the segments 1c', 5c', 4c' and 3c' to the jumper strand segments 1d, 5d, 4d, 3d. The segments 2c and 2c' are also illustrated In FIG. 1D, the segments 1c–5c associated with the second level of metallization (M2) are illustrated as extending opposite the segments 1c–5c associated with the first level of metallization (M1). In FIG. 1E, the conductive vias B2–E2 are illustrated as electrically connecting segments 1e' and 3e'–5e' at the first level of metallization (M1) to the jumper strand segments 1d and 3d–5d at the second level of metallization (M2).

Accordingly, the inductor of FIGS. 1A–1E includes a semiconductor substrate layer 14 and a plurality of first strands of conductive traces 1–5 that are electrically coupled in parallel and extend side-by-side across the substrate layer 14. Each of the plurality of first strands of conductive traces 1–5 includes a respective plurality of crossing strand segments at a first level of metallization (see, e.g., 1b', 2d' and 3f'). These crossing strand segments enable each respective first strand to be repeatedly transposed from one side of the plurality of first strands to another side of the plurality of first strands without electrical interruption. For example, the crossing strand segment 1b' enables the strand 1 to be transposed from one side of the plurality of first strands 1–5 (shown as the right side) to another side of the plurality of first strands 1–5 (shown as the left side) without electrical interruption. A plurality of second strands of conductive traces 1'–5' are also provided. These second strands of conductive traces 1'–5' are also electrically coupled in parallel and extend side-by-side across the substrate 14. Each of the plurality of second strands of conductive traces 1'–5' includes a plurality of jumper strand segments at a second level of metallization. For example, strand 5' includes jumper strand segments 5b, 5d and 5f. These jumper strand segments are contiguous with portions of the overlapping strand 5. In this manner, strands 5 and 5' are electrically connected together at multiple locations along their length.

Figure 1F:
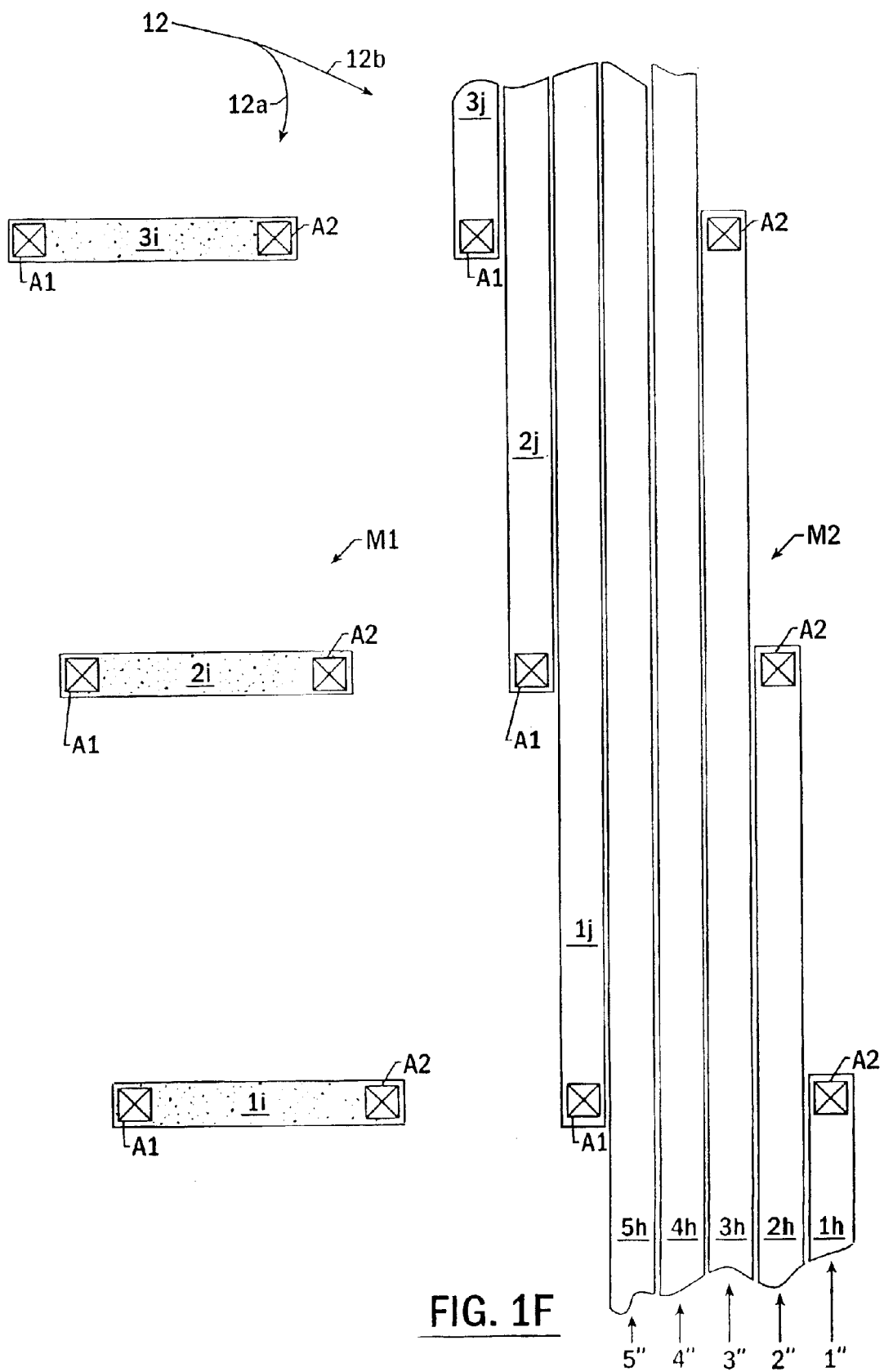
FIG. 1F is a plan view of a multi-strand inductor according to another embodiment of the present invention.

Referring now to FIG. 1F, a multi-strand inductor 12 according to another embodiment of the present invention includes multiple strands 1"–5" that are formed at a second level of metallization (M2). Like the embodiment of FIGS. 1A–1E, these strands 1"–5" are electrically coupled in parallel and extend side-by-side across an integrated circuit substrate. Crossing strand segments, including segments 1i–3i and similar segments (not shown) on the left side of FIG. 1F, enable each respective strand to be repeatedly transposed from one side of the plurality of strands 1"–5" to another side of the plurality of strands 1"–5" without electrical interruption.

Figure 2:
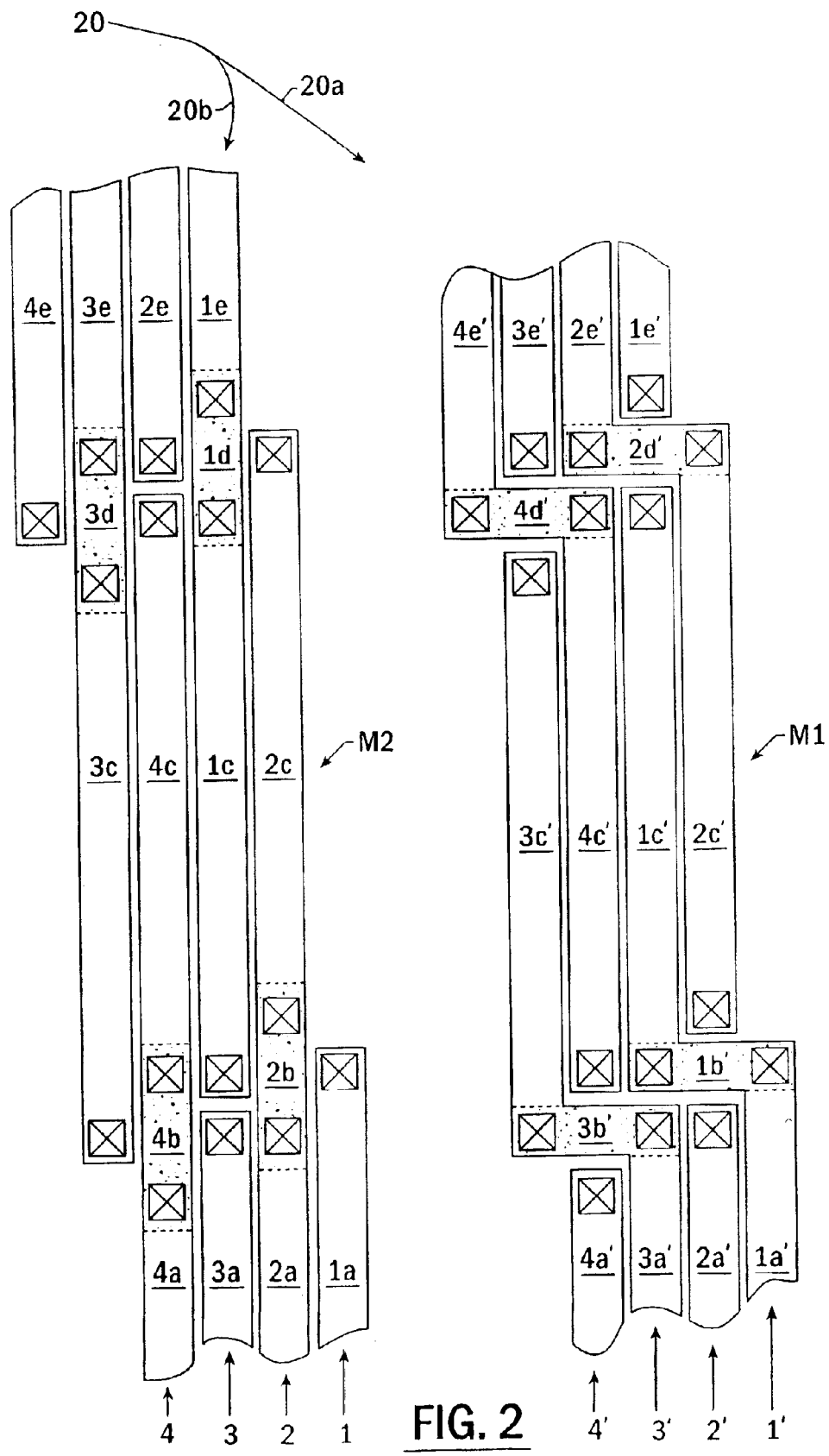
FIG. 2 is a plan view of a multi-strand inductor according to another embodiment of the present invention.

FIG. 2 illustrates a multi-strand inductor 20 according to another embodiment of the present invention. In this embodiment, a plurality of strands of conductive traces are provided. These strands of conductive traces are electrically coupled in parallel and extend side-by-side across a substrate. Each of the plurality of strands includes a plurality of crossing strand segments that enable the respective strand to be repeatedly transposed from one side of the plurality of strands to another side of the plurality of strands without electrical interruption. The regions of the inductor 20 associated with first and second levels of metallization are illustrated by reference numerals 20a and 20b, respectively. A first strand 1 is illustrated as including primary strand segments 1a and 1c–1e at the second level of metallization (M2) and crossing strand segment 1b' at the first level of metallization (M1). A second strand 2 is illustrated as including primary strand segments 2a–2c and 2e at the second level of metallization (M2) and crossing strand segment 2d' at the first level of metallization (M1). These first and second strands 1 and 2 constitute a plurality of strands that are periodically transposed with each other from one side of the pair of strands 1–2 to an opposite side of the pair of strands 1–2. A third strand 3 is illustrated as including primary strand segments 3a and 3d–3e at the second level of metallization (M2) and crossing strand segment 3b' at the first level of metallization (M1). A fourth strand 4 is illustrated as including primary strand segments 4a–4c and 4e at the second level of metallization (M2) and crossing strand segment 4d' at the first level of metallization (M1). These third and fourth strands 3 and 4 also constitute a separate plurality of strands that are periodically transposed with each other from one side of the pair of strands 3–4 to an opposite side of the pair of strands 3–4.

Referring now to the right side of FIG. 2, a first pair of strands 1' and 2' and a second pair of strands 3' and 4' are illustrated. The strand 1' includes primary strand segments 1a', 1c' and 1e' and crossing strand segment 1b' at level M1 and jumper strand segment 1d at level M2. The strand 2' includes primary strand segments 2a', 2c' and 2e' and crossing strand segment 2d' at level M1 and jumper strand segment 2b at level M2. The strand 3' includes primary strand segments 3a', 3c' and 3e' and crossing strand segment 3b' at level M1 and jumper strand segment 3d at level M2. The strand 4' includes primary strand segments 4a', 4c' and 4e' and crossing strand segment 4d' at level M1 and jumper strand segment 4b at level M2.

Figure 3A:
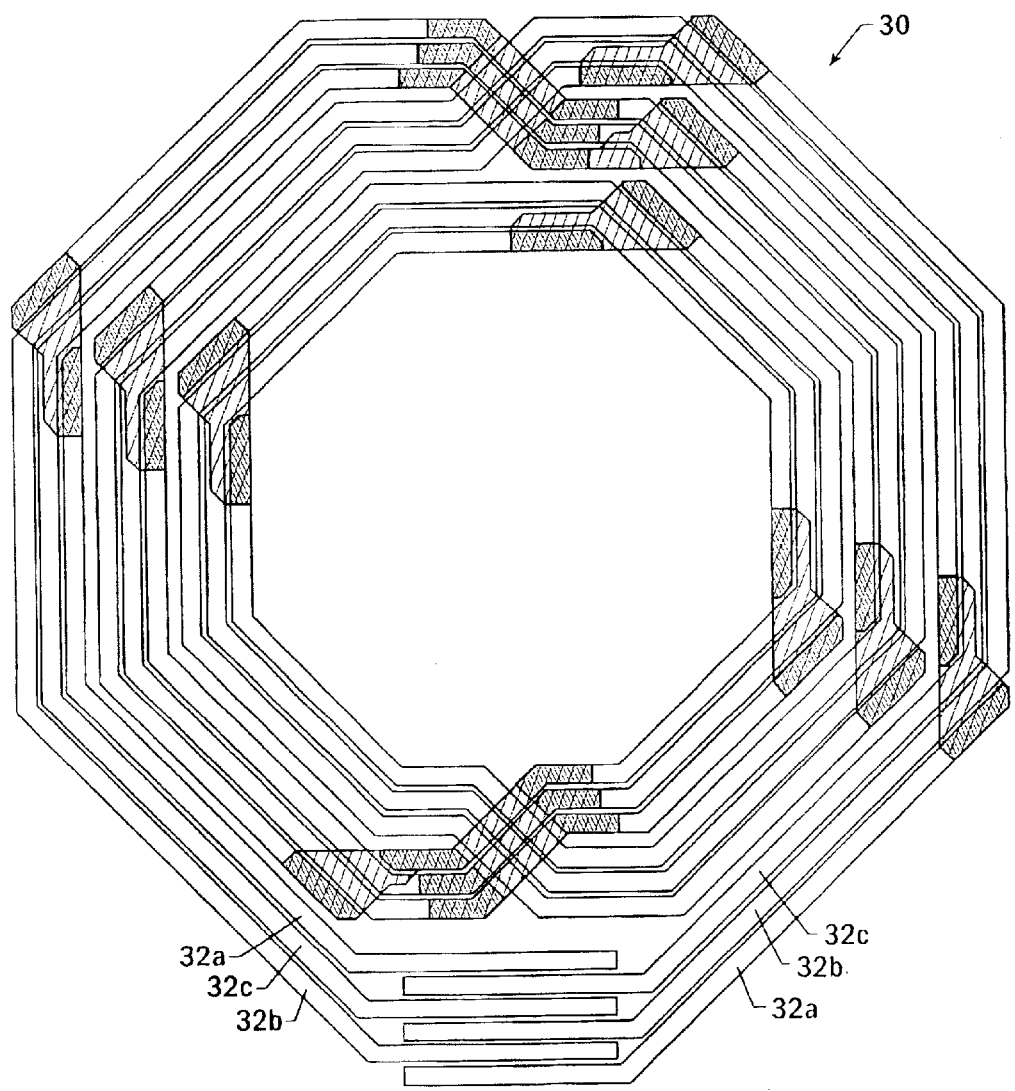
FIG. 3A is a plan view of an inductor having multiple strands of conductive traces that are substantially concentric, according to another embodiment of the present invention.
Figure 3B:
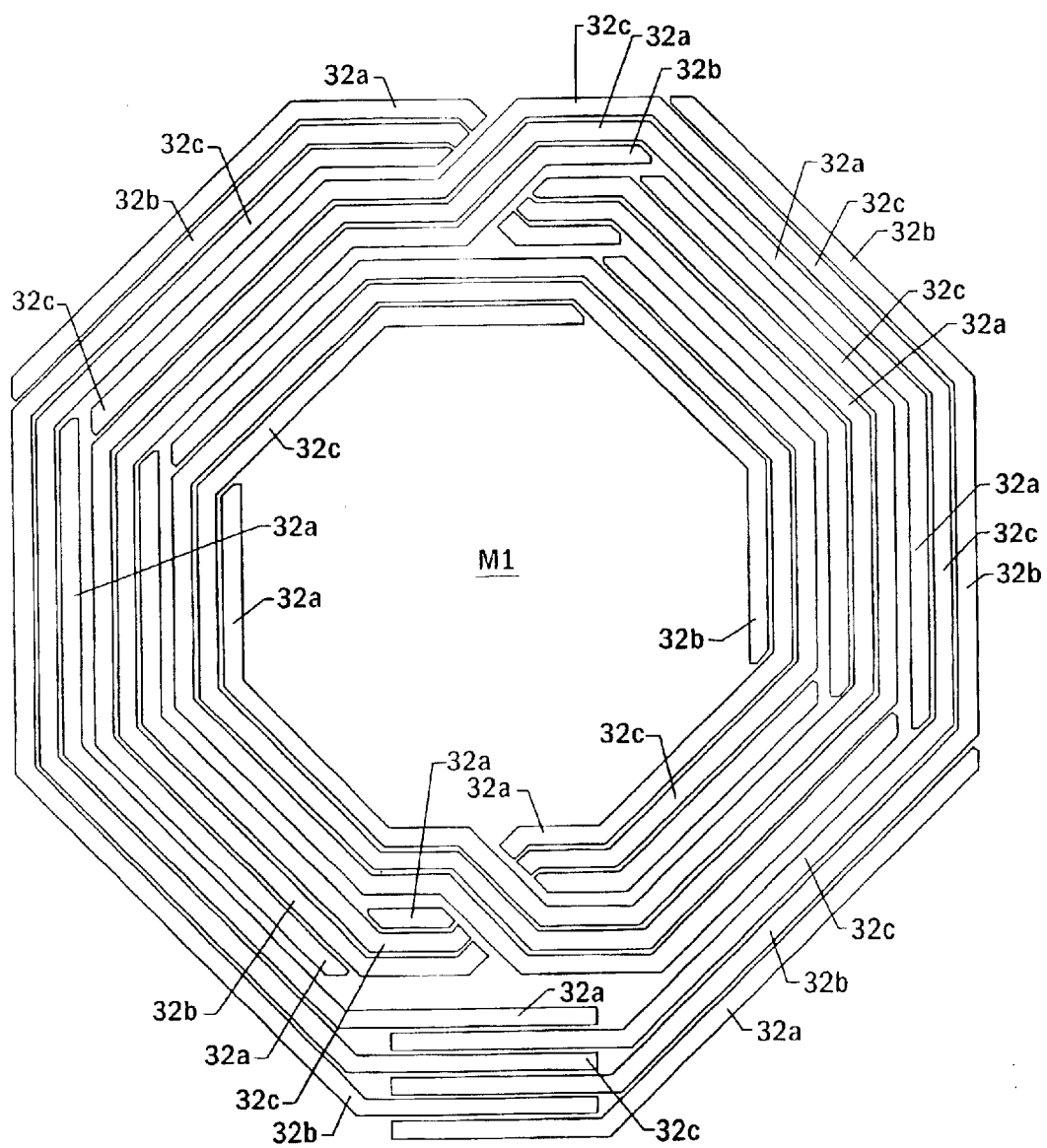
FIG. 3B is a plan view of primary strand segments that can be used to partially define the inductor of FIG. 3A.
Figure 3C:
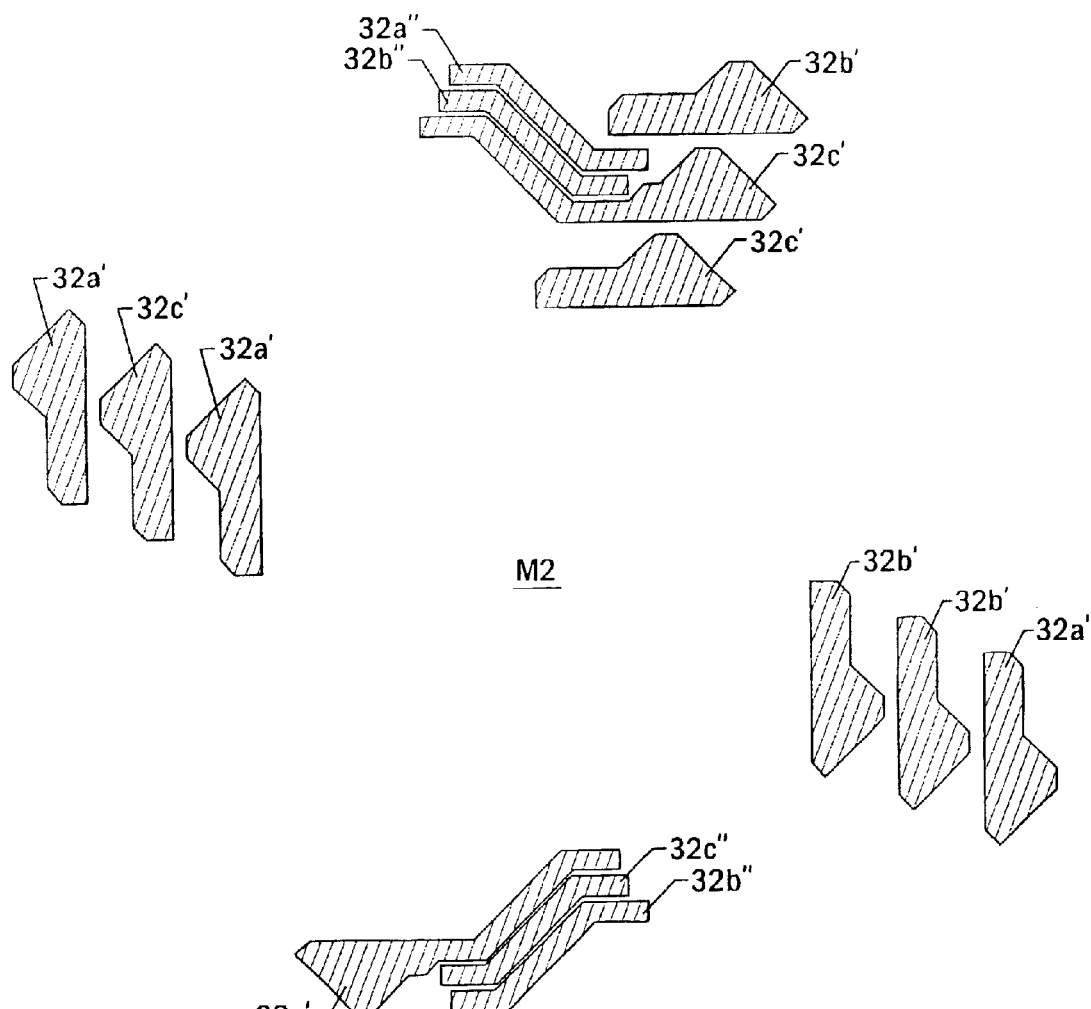
FIG. 3C is a plan view of crossing strand segments that can be used to facilitate transposition of the conductive traces illustrated by FIG. 3B.
Figure 3D:
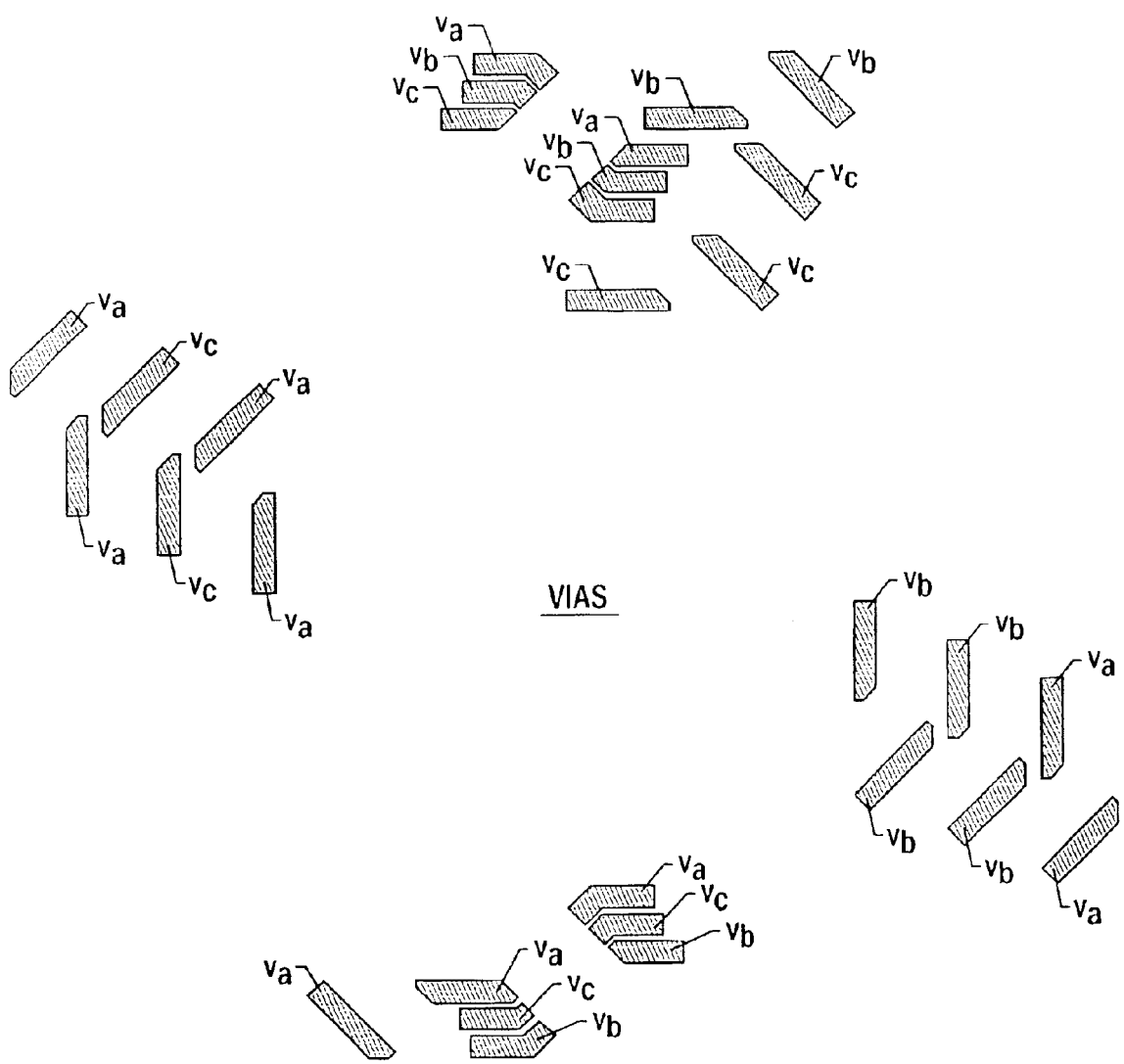
FIG. 3D is a plan view of conductive vias that can be used to interconnect the crossing strand segments and primary strand segments illustrated by FIGS. 3B and 3C.

Referring now to FIGS. 3A–3D, an inductor 30 according to another embodiment of the present invention will be described. This inductor 30, which is similar to the inductor embodiment 12 of FIG. 1F, includes a plurality of primary strand segments, shown as 32a, 32b and 32c, that are substantially concentric. Crossing and jumper strand segments are also provided to enable the transposition of the primary strand segments 32a, 32b and 32c. As illustrated best by FIG. 3B, the primary strands 32a, 32b and 32c are patterned at a first level of metallization (M1). In FIG. 3C, the crossing strand segments are identified by the reference numbers 32a', 32b' and 32c' and the jumper strand segments are identified by the reference numbers 32a", 32b" and 32c". These crossing and jumper strand segments may be formed at a second level of metallization (M2). These primary, crossing and jumper strand segments are electrically connected together by conductive vias. These conductive vias are illustrated as Va, Vb or Vc in FIG. 3D, depending on whether the via is associated with a first strand (segments 32a–32a"), a second strand (segments 32b–32b") or a third strand (segments 32c–32c").

Figure 4A:
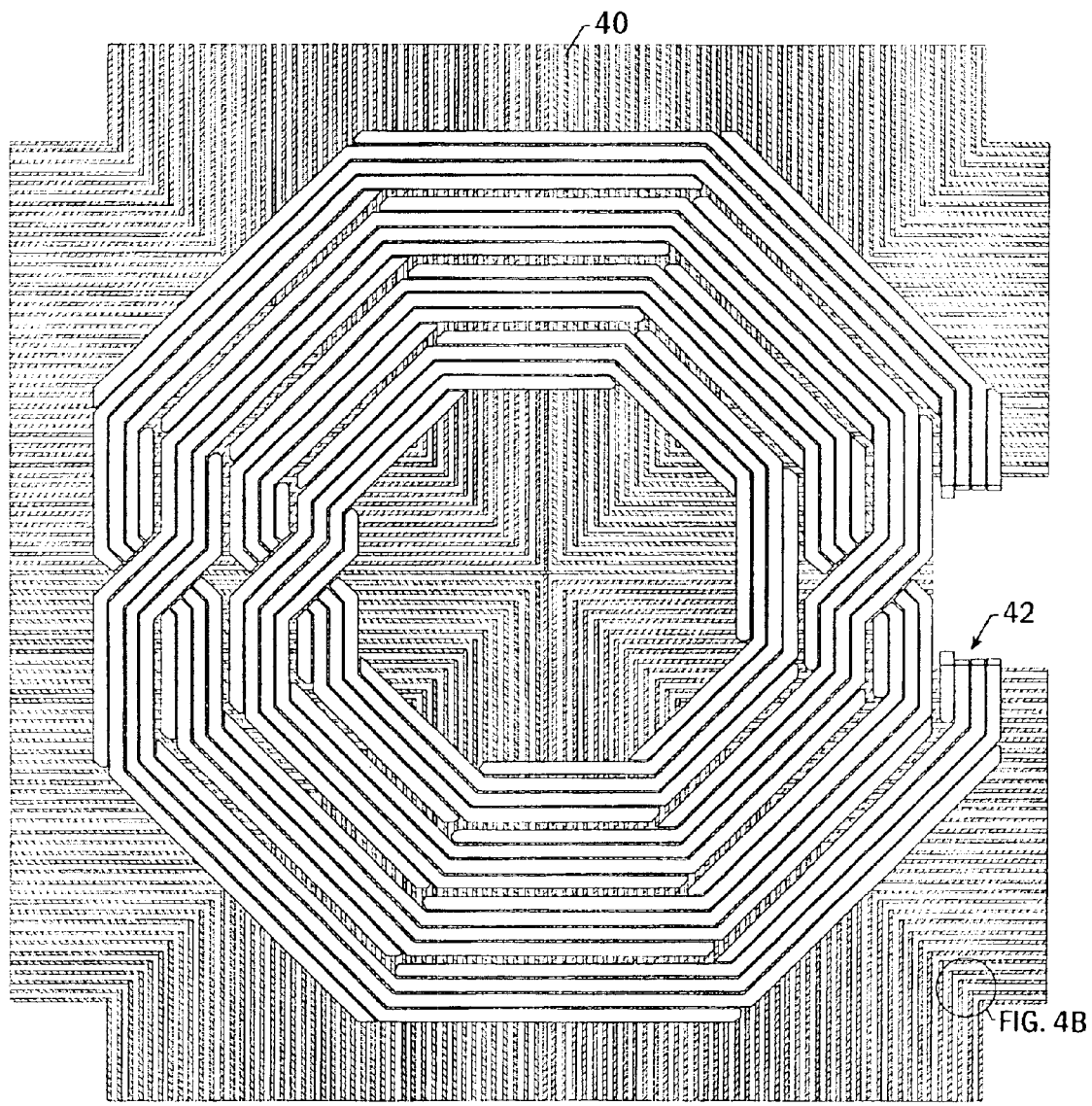
FIG. 4A is a plan view of alternating N-type and P-type well regions that operate to reduce eddy currents within a semiconductor substrate when used in conjunction with an inductor according to an embodiment of the present invention.
Figure 4B:
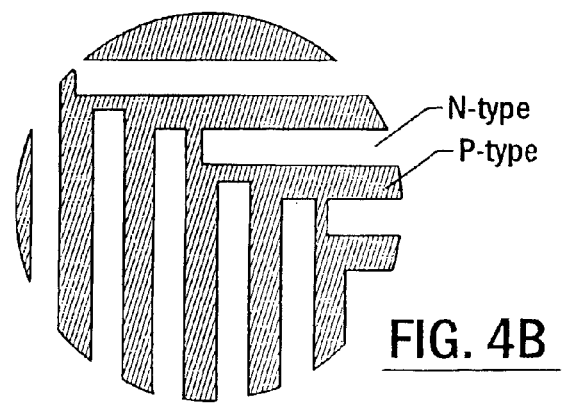
FIG. 4B is an enlarged plan view of a highlighted portion of FIG. 4A.

In FIG. 4A, a plan view of alternating N-type and P-type well regions 40 is provided. These alternating well regions provide a high resistance path in a semiconductor substrate (e.g., bulk semiconductor substrate). This high resistance path operates to reduce eddy currents within a semiconductor substrate when used in conjunction with an inductor according to an embodiment of the present invention. An exemplary inductor may include a plurality of primary strand segments 42 that are concentrically arranged. These N-type and P-type well regions are preferably elongate regions that extend in a lengthwise direction. This lengthwise direction is at least substantially orthogonal (e.g., $\geq 45°$) to the plurality of primary strand segments. In FIG. 4B, which represents an enlarged plan view of a portion of the alternating regions illustrated by FIG. 4A, the P-type well regions are illustrated as being electrically coupled together at multiple locations. These P-type well regions may be formed within a deeper N-type well region. Eddy current losses can also be reduced by defining an inductor using uppermost levels of metallization that are relatively distant from the substrate.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A high-Q inductor, comprising:
   an integrated circuit substrate;
   a plurality of strands of conductive traces that are electrically coupled in parallel and extend side-by-side across said integrated circuit substrate, with each of said plurality of strands comprising a plurality of crossing strand segments that enable the respective strand to be repeatedly transposed from one side of the plurality of strands to another side of the plurality of strands without electrical interruption; and
   a repeating alternating sequence of N-well and P-well regions that are disposed side-by-side in a portion of said integrated circuit substrate extending opposite said plurality of strands.

2. The inductor of claim 1, wherein said plurality of strands are electrically insulated from each other over at least a majority of their length.

3. The inductor of claim 1, wherein each of said plurality of strands also comprises a corresponding plurality of primary strand segments that are electrically linked together end-to-end by a corresponding plurality of the crossing strand segments.

4. The inductor of claim 3, wherein the primary strand segments and the crossing strand segments are on different levels of metallization.

5. The inductor of claim 4, wherein the primary strand segments and the crossing strand segments for each respective strand are electrically coupled together by conductive vias that extend through an electrically insulating layer disposed between the different levels of metallization.

6. The inductor of claim 1, wherein said plurality of strands extend side-by-side in a vertical plane that is at least substantially orthogonal to a surface of said integrated circuit substrate.

7. The inductor of claim 1, wherein said plurality of strands extend side-by-side in a horizontal plane that is at least substantially parallel to a surface of said integrated circuit substrate; and wherein the plurality of crossing strand segments are cross-over/under strand segments.

8. A high-Q inductor, comprising:
   an integrated circuit substrate;
   a plurality of first strands of conductive traces that are electrically coupled in parallel and extend side-by-side across said integrated circuit substrate, with each of said plurality of first strands comprising a respective plurality of crossing strand segments at a first level of metallization that enable the respective first strand to be repeatedly transposed from one side of the plurality of first strands to another side of the plurality of first strands without electrical interruption;
   a plurality of second strands of conductive traces that are electrically coupled in parallel and extend side-by-side across said integrated circuit substrate, with each of said plurality of second strands comprising a respective plurality of jumper strand segments at a second level of metallization that enable the respective second strand to electrically jump a plurality of the crossing strand segments associated with said plurality of first strands; and
   a repeating alternating sequence of N-well and P-well regions that are disposed side-by-side in a portion of said integrated circuit substrate extending opposite said first plurality of first strands.

9. The inductor of claim 8, wherein each of said plurality of first strands also comprises a corresponding plurality of primary strand segments that are electrically linked together end-to-end by a corresponding plurality of the crossing strand segments.

10. The inductor of claim 9, wherein the primary strand segments and the crossing strand segments are on different levels of metallization.

11. The inductor of claim 10, wherein the primary strand segments and the crossing strand segments associated with each of said plurality of first strands are electrically coupled together by conductive vias that extend through an electrically insulating layer disposed between the different levels of metallization.

12. The inductor of claim 10, wherein each of the plurality of jumper strand segments is contiguous with a corresponding one of the primary strand segments associated with a respective one of said plurality of first strands.

13. A high-Q inductor, comprising:
   an integrated circuit substrate;
   a plurality of first strands of conductive traces that are electrically coupled in parallel and extend side-by-side across said integrated circuit substrate, with each of said plurality of first strands comprising a respective plurality of crossing strand segments at a first level of metallization that are spaced along its length and patterned to enable the respective first strand to be repeatedly transposed from one side of the plurality of first strands to another side of the plurality of first strands without electrical interruption; and a plurality of second strands of conductive traces that are electrically coupled in parallel and extend side-by-side across said integrated circuit substrate, with each of said plurality of second strands comprising a respective plurality of jumper strand segments at a second level of metallization that are spaced along its length and patterned to enable the respective second strand to electrically jump a plurality of the crossing strand segments associated with said plurality of first strands.

14. The inductor of claim 13, wherein each of said plurality of first strands also comprises a corresponding plurality of primary strand segments that are electrically linked together end-to-end by a corresponding plurality of the crossing strand segments.

15. The inductor of claim 14, wherein the primary strand segments and the crossing strand segments are on different levels of metallization.

16. The inductor of claim 15, wherein the primary strand segments and the crossing strand segments associated with each of said plurality of first strands are electrically coupled together by conductive vias that extend through an electrically insulating layer disposed between the different levels of metallization.

17. The inductor of claim 15, wherein each of the plurality of jumper strand segments is contiguous with a corresponding one of the primary strand segments.

18. A high-Q inductor, comprising:

a semiconductor substrate;

a plurality of strands of conductive traces that are electrically coupled in parallel and extend side-by-side across said semiconductor substrate in a horizontal plane that is at least substantially parallel to a surface of said integrated circuit substrate, with each of said plurality of strands comprising a plurality of crossing strand segments that enable the respective strand to be repeatedly transposed from one side of the plurality of strands to another-side of the plurality of strands without electrical interruption; and a plurality of alternating N-well and P-well regions that are disposed side-by-side in said semiconductor substrate, underneath said plurality of strands.

19. The inductor of claim 18, wherein said plurality of alternating N-well and P-well regions are elongate regions that extend in a direction at least substantially orthogonal to at least portions of said plurality of strands.

20. A high-Q inductor, comprising.

an integrated circuit substrate; and a plurality of strands of concentrically arranged conductive traces that are electrically coupled in parallel and extend side-by-side across said integrated circuit substrate in a horizontal plane that is at least substantially parallel to a surface of said integrated circuit substrate, with each of said plurality of strands comprising a plurality of crossing strand segments that enable the respective strand to be repeatedly transposed from one side of the plurality of strands to another side of the plurality of strands without electrical interruption.

21. The inductor of claim 20, further comprising a plurality of alternating N-well and P-well regions that are disposed side-by-side in said integrated circuit substrate, underneath said plurality of strands.

22. The inductor of claim 21, wherein said plurality of alternating N-well and P-well regions are elongate regions that extend in a lengthwise direction at least substantially orthogonal to at least portions of said plurality of strands.

* * * * *